(12) United States Patent
Kurita

(10) Patent No.: US 8,915,760 B2
(45) Date of Patent: Dec. 23, 2014

(54) SURFACE MOUNT CLIP

(71) Applicant: Kitagawa Industries Co., Ltd., Inazawa-shi, Aichi (JP)

(72) Inventor: Tomohisa Kurita, Kasugai (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 0 days.

(21) Appl. No.: 13/862,574

(22) Filed: Apr. 15, 2013

(65) Prior Publication Data

US 2013/0280968 A1 Oct. 24, 2013

(30) Foreign Application Priority Data

Apr. 18, 2012 (JP) ................................ 2012-094812
Jun. 4, 2012 (JP) ................................ 2012-127098

(51) Int. Cl.
*H01R 13/6595* (2011.01)
*H01R 4/48* (2006.01)
*H05K 9/00* (2006.01)
*H01R 12/71* (2011.01)

(52) U.S. Cl.
CPC .............. *H01R 4/48* (2013.01); *H01R 13/6595* (2013.01); *H05K 9/0035* (2013.01); *H01R 12/718* (2013.01)
USPC ....................................................... 439/863

(58) Field of Classification Search
USPC .................. 439/863, 32, 92.376; 174/355
See application file for complete search history.

(56) References Cited

U.S. PATENT DOCUMENTS

| 3,369,210 | A | * | 2/1968 | Menickella | ..................... 439/32 |
| 5,043,528 | A | * | 8/1991 | Mohr | ............................ 174/355 |
| D410,226 | S | * | 5/1999 | Yoshiura | ...................... D13/133 |
| 6,077,095 | A | * | 6/2000 | DelPrete et al. | ................ 439/92 |
| 6,500,012 | B1 | * | 12/2002 | Billenstein et al. | ............. 439/92 |
| D483,330 | S | * | 12/2003 | Chen | ............................ D13/133 |
| D607,835 | S | * | 1/2010 | Huang | ......................... D13/154 |
| D624,025 | S | * | 9/2010 | Luo et al. | ..................... D13/154 |
| 8,602,811 | B2 | * | 12/2013 | Takahashi | ..................... 439/376 |
| D706,224 | S | * | 6/2014 | Kimura et al. | ............... D13/154 |

FOREIGN PATENT DOCUMENTS

JP 2003-51690 A 2/2003
JP 2005-332953 A 12/2005

* cited by examiner

*Primary Examiner* — Alexander Gilman

(74) *Attorney, Agent, or Firm* — Davis & Bujold, PLLC; Michael J. Bujold

(57) ABSTRACT

A surface mount clip includes a base part having a rear surface electrically connected to a conductor part of a printed wiring board; and an extension part extending from the base part. The extension part contacts with a conductive member attached to the printed wiring board with elastic deformation of the extension part to hold the conductive member and make electrical connection thereto. The base part includes a solder-bonding part having a bonding plane to be bonded with the printed wiring board and a floating part forming a gap from the printed wiring board in a state that the solder-bonding part is solder-bonded to the printed wiring board. The extension part includes a root part extending from the floating part toward the rear surface of the base part and a folded-back part extending from an end of the root part toward a front surface of the base part.

11 Claims, 7 Drawing Sheets

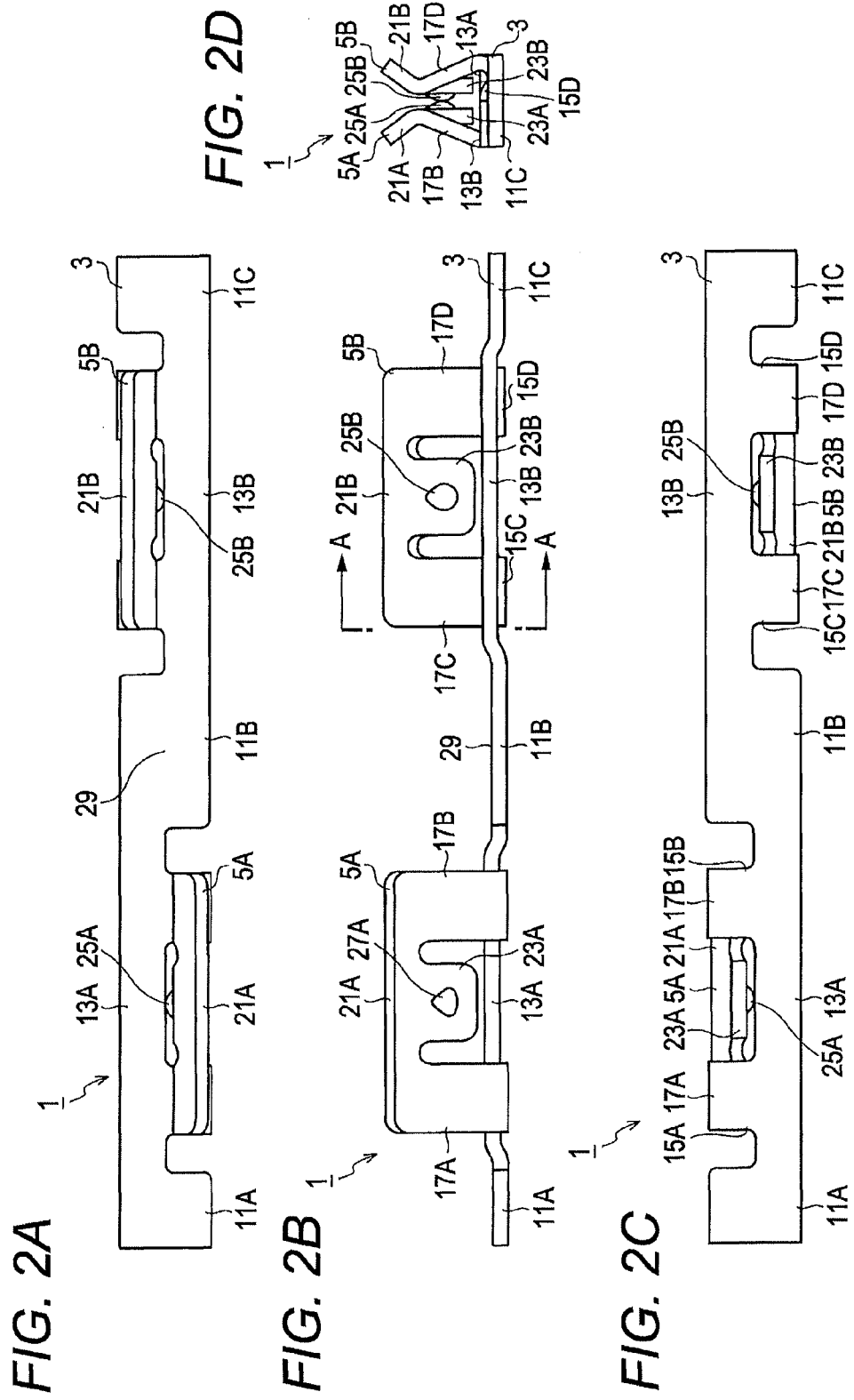

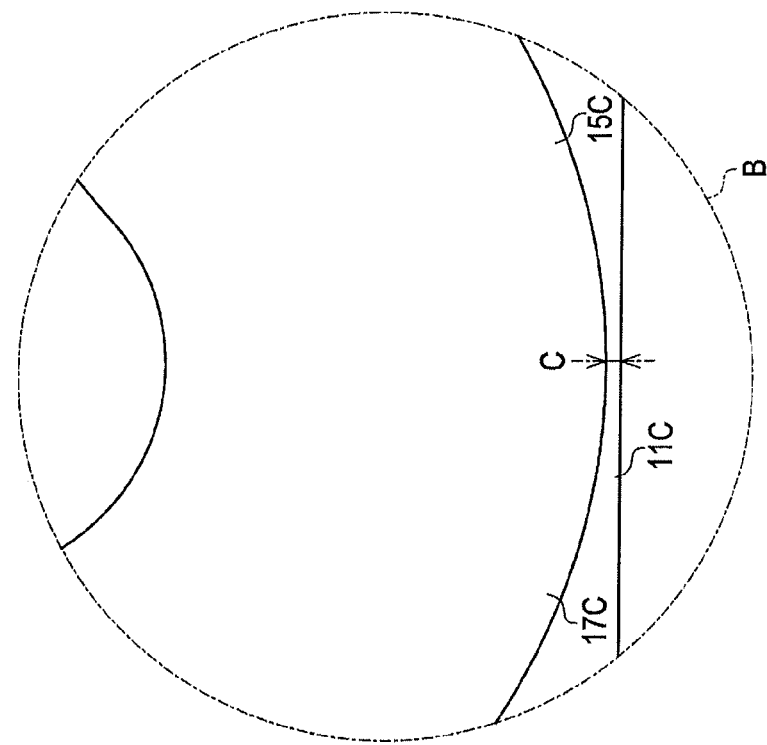
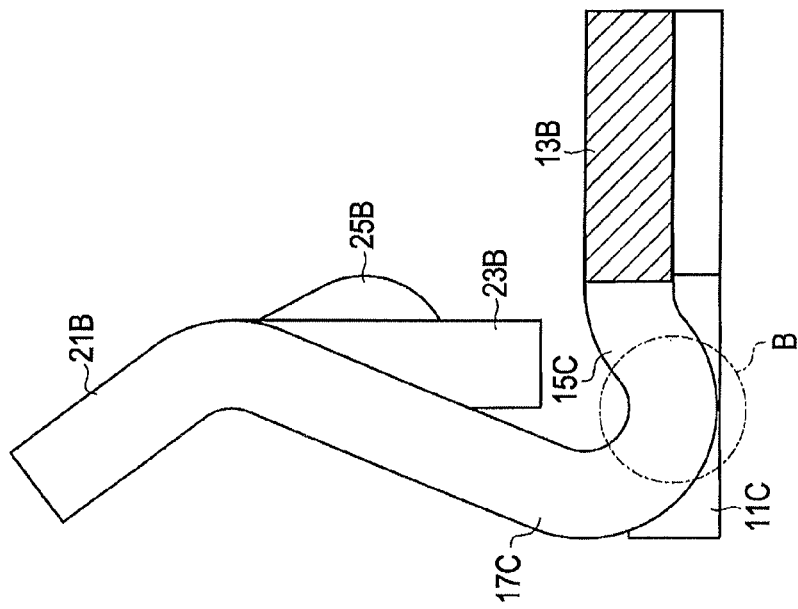

SURFACE MOUNT CLIP

CROSS-REFERENCE TO RELATED APPLICATION

This application is based on Japanese Patent Applications No. 2012-094812 filed with the Japan Patent Office on Apr. 18, 2012, and No. 2012-127098 filed with the Office on Jun. 4, 2012, the entire contents of which are hereby incorporated by reference.

BACKGROUND

1. Technical Field

The present disclosure relates to a surface mount clip to be surface-mounted on a printed wiring board.

2. Related Art

Surface mount clips are used, for example, for fixing another conductive member (such as a shielding case) to a printed wiring board. Conventionally, such surface mount clips have been proposed in, for example, n JP-A-2003-51690 (Patent Document 1) and JP-A-2005-332953 (Patent Document 2). These surface mount clips have a base part soldered to a printed wiring board and an extension part extending from the base part. When the extension part is in contact with a conductive member (such as a shielding case) through elastic deformation, the surface mount clip holds the conductive member with the elastic force of the extension part.

With such a surface mount clip, the conductive member can be fixed onto the printed wiring board and the conductive member can therefore be electrically connected to a conductive pattern (such as a portion having a ground potential) included in the printed wiring board.

SUMMARY

This section provides a general summary of the disclosure, and is not a comprehensive disclosure of its full scope or all of its features.

A surface mount clip includes: a base part having a rear surface electrically connected to a conductor part of a printed wiring board; and an extension part extending from the base part, the extension part being configured to be brought into contact with a conductive member attached to the printed wiring board in connection with elastic deformation of the extension part to hold the conductive member and make electrical connection to the conductive member, wherein the base part includes a solder-bonding part having a bonding plane to be bonded with the printed wiring board and a floating part forming a gap from the printed wiring board in a state that the solder-bonding part is solder-bonded to the printed wiring board; and the extension part includes a root part extending from the floating part toward the rear surface of the base part and a folded-back part extending from an end of the root part toward a front surface of the base part.

BRIEF DESCRIPTION OF DRAWINGS

FIG. 2A is a plan view of the surface mount clip according to the first embodiment, and FIG. 2B is a front view thereof, FIG. 2C is a bottom view thereof, and FIG. 2D is a right side view thereof.

FIG. 3A is an enlarged view (enlarged sectional view) of a sectional plane taken along line A-A in FIG. 2B of the surface mount clip according to the first embodiment.

FIG. 3B is an enlarged view of an area B depicted in FIG. 3A in this surface mount clip.

FIG. 6A is a plan view depicting an example in which an extension part is disposed on an outer peripheral side of a shielding case; FIG. 6B is a plan view depicting an example in which the extension part is disposed on an inner peripheral side of the shielding case; and FIG. 6C is a plan view depicting an example in which the extension part is disposed on the outer and inner peripheral sides of the shielding case.

FIG. 7A is a front view depicting an example in which the surface mount clip having the extension part disposed on the outer peripheral side of the shielding case cooperates with another member to hold the shielding case; FIG. 7B is a front view depicting an example in which the surface mount clip having the extension part disposed on the inner peripheral side of the shielding case cooperates with another member to hold the shielding case; FIG. 7C is a front view depicting an example in which the surface mount clip having the extension part disposed on the outer peripheral side of the shielding case cooperates with another member to hold the shielding case; and FIG. 7D is a front view depicting an example in which the surface mount clip having the extension part disposed on the inner peripheral side of the shielding case cooperates with another member to hold the shielding case.

DETAILED DESCRIPTION

Figure 1A:
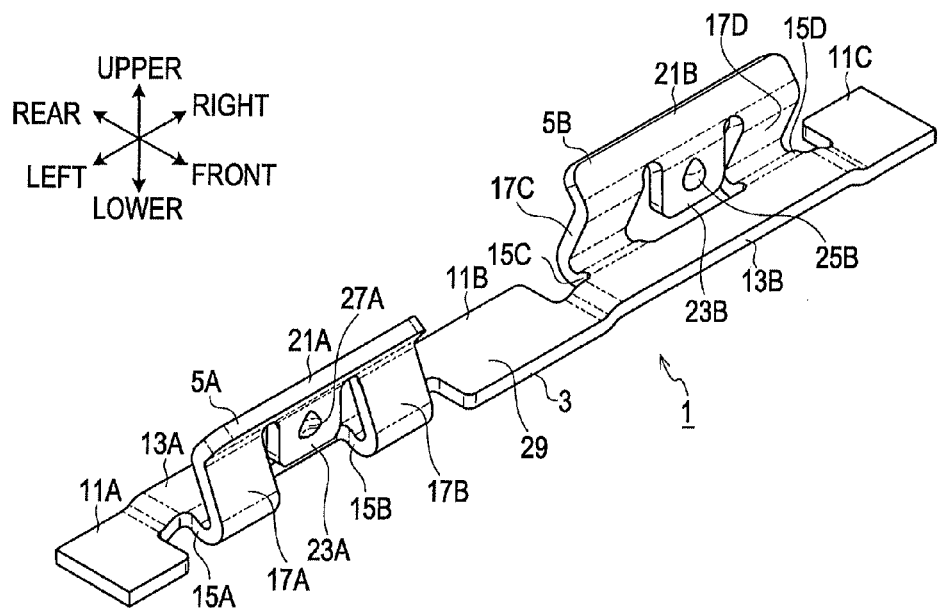
FIG. 1A is a perspective view depicting a surface mount clip according to a first embodiment from the front on the upper left.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The surface mount clips according to the above Patent Documents 1 and 2 still have room to be improved in the following points.

First, in the case of the surface mount clip according to Patent Document 1, the extension part extends from the base part at a position where the base part is bonded to the printed wiring board. This easily brings molten solder on the printed wiring board in contact with the extension part, whereby the solder easily wets over the extension part. Note that "the solder wets over" means the phenomenon in which the molten solder wets a surface with excellent solder wettability and the solder goes up along the surface.

However, if extra solder exists on the printed wiring board, the amount of solder wetting over the extension part is increased accordingly. Thus, the somewhat large amount of solder having wetted over is sometimes solidified to form a somewhat large fillet, in which case the rigidity of the extension part is increased to interrupt the elastic deformation of the extension part. This leads to a problem that it becomes difficult for the surface mount clip to hold the conductive member.

Meanwhile, in the case of the surface mount clip according to Patent Document 2, a gap is formed between a part of the base part and the printed wiring board. From this gap, the extension part extends. Even in the presence of extra solder on the printed wiring board, this configuration makes it difficult for the molten solder to touch the extension part. Therefore, it might be possible to suppress the solder wetting over the extension part.

However, when the solder wetting by the extra solder over the extension part is suppressed as above, the extra solder might flow toward a component other than the surface mount clip. This might cause a problem to such a component due to the solder.

Such a structure, in which the extension part extends from the gap between the base part and the printed wiring board, has the following problem: The dimension from the printed wiring board to an end of the extension part (hereinafter called height-direction dimension) is larger than that of the surface mount clip according to Patent Document 1 by the amount of the gap even though the extension parts have the same height-direction dimension.

Compact electronic appliances (for example, mobile appliances such as mobile terminals and mobile phones) are required to have surface mount components with lower height. Thus, in some cases, the surface mount clip with the configuration as above cannot be employed. Of course, the height-direction dimension of the extension part itself may be reduced for simply lowering the height; however, in this case, a part of the extension part, which functions as a spring, becomes short. Thus, the extension part elastically deforms less easily. As a result, it becomes difficult for the surface mount clip to hold the conductive member.

An object of the present disclosure is to provide a surface mount clip that can ensure sufficient spring length of the extension part, whose height is reduced, and whose spring property of the extension part is difficult to deteriorate even in the presence of extra solder.

A surface mount clip of the present disclosure (the present clip) includes: a base part having a rear surface electrically connected to a conductor part of a printed wiring board; and an extension part extending from the base part, the extension part being configured to be brought into contact with a conductive member attached to the printed wiring board in connection with elastic deformation of the extension part to hold the conductive member and make electrical connection to the conductive member, wherein: the base part includes a solder-bonding part having a bonding plane to be bonded with the printed wiring board and a floating part forming a gap from the printed wiring board in a state that the solder-bonding part is solder-bonded to the printed wiring board; and the extension part includes a root part extending from the floating part toward the rear surface of the base part and a folded-back part extending from an end of the root part toward a front surface of the base part.

According to the present clip, when the molten solder flows into the gap between the extension part and the printed wiring board, the molten solder also wets over toward the root part; therefore, the amount of the solder wetting over toward the folded-back part is reduced.

For example, the present clip and a first conventional surface mount clip described below are compared. The first surface mount clip has neither a part corresponding to the floating part nor a part corresponding to the root part. Further, the first surface mount clip has an extension part with a shape equivalent to the folded-back part. This extension part extends from a base part positioned in contact with a printed wiring board. As compared with the first conventional surface mount clip, the amount of solder wetting over the folded-back part is reduced even in the presence of extra solder in the present clip. Thus, the deterioration of the spring property of the folded-back part is suppressed.

Furthermore, the folded-back part of the present clip extends from the root part. This root part extends toward a rear surface of the base part. Therefore, the roof part is closer to the printed wiring board than the floating part. For example, the present clip is compared with a second conventional surface mount clip described below. The second surface mount clip has a part corresponding to the floating part but does not have a part corresponding to the root part. Further, the second surface mount clip has an extension part with a shape equivalent to the folded-back part. This extension part extends from the area corresponding to the floating part. As compared with the second conventional surface mount clip, the present clip can be reduced in height. Moreover, the height reduction as above can be achieved without shortening the length of the extension part; therefore, the spring property of the extension part is not deteriorated unnecessarily.

As for the present clip, one present clip (one base part) may have a single extension part or may have a plurality of extension parts. More specifically, for example, a plurality of present clips each having a single extension part may be used. In this case, the extension parts included in the present clips may cooperate with each other to hold the conductive member. Alternatively, the extension part of the present clip having a single extension part may cooperate with another component to hold the conductive member.

In the case of the present clip having a single extension part, it is difficult for the present clip alone to hold the conductive member; however, by disposing the two or more of the present clips at predetermined positions according to the shape of the conductive member, the conductive member can be held in a manner that the conductive member is sandwiched between the extension parts.

Alternatively, even when a small number of present clips are used, the conductive member can be held in a manner that the conductive member is pressed against another component or the conductive member is hung on another component. In other words, due to the restriction of the movement by the other component, the conductive member can be held so as to move only in a predetermined direction. One or more of the present clips further restrict the movement of the conductive member. This allows the conductive member to be held so as not to move from the predetermined position. In other words, in the case of using a small number of (for example, one) present clips, the present clips can hold the conductive member by cooperating with the other component.

Moreover, in the present clip, the base part is preferably provided with a suction plane that can be sucked with a suction nozzle of an automatic packaging machine or the like. The present clip can be sucked when the suction plane is sucked with the suction nozzle. Thus, the sucked surface mount clip can be easily transferred from an embossed tape or an embossed tray to the printed wiring board.

On the other hand, the present clip may hold the conductive member in the following manner. For example, the plural extension parts of the plural present clips each having the plural extension parts may cooperate with each other to hold the conductive member. Alternatively, the extension parts of the present clip having the plural extension parts may cooperate with another component to hold the conductive member.

Further alternatively, the extension parts of one present clip may cooperate with each other to hold the conductive member.

Even the present clip having the plural extension parts can hold the conductive member. That is, two or more of the present clips are disposed at predetermined positions according to the shape of the conductive member. Thus, the conductive member is sandwiched between the extension parts of each present clip.

Alternatively, even when a small number of present clips are used, the conductive member can be held in a manner that the conductive member is pressed against another component or the conductive member is hung on another component. In other words, due to the restriction of the movement by the other component, the conductive member can be held so as to move only in a predetermined direction. One or more of the present clips further restrict the movement of the conductive member. This allows the conductive member to be held so as not to move from the predetermined position.

Further, the conductive member can be held by being sandwiched between plural extension parts included in one present clip depending on the positional relation between the extension parts (when the positions of (interval between) the plural extension parts are suitable for the conductive member to be sandwiched). That is, in the case where one present clip has the plural extension parts, whether the conductive member can be held between the extension parts is arbitrary (depending on the dimension and/or the shape of the conductive member). The present clip may be able to hold the conductive member alone. Alternatively, the present clip may be configured so that the plural present clips cooperate with each other to hold the conductive member.

The present clip preferably has such a shape as having rotational symmetry (for example dyad symmetry). In other words, the present clip preferably has the shape remaining the same after half the rotation along an axis of symmetry. The axis of symmetry is an axial line extending in a direction substantially orthogonal to a bonding plane of the solder bonding part.

The present clip is housed in, for example, an embossed tape or an embossed tray and supplied to an automatic packaging machine. When the present clip has rotational symmetry, the present clip can be housed in an embossed tape or an embossed tray in a half-turned state.

The present clip with the rotational symmetry preferably has a suction plane that can be sucked with a suction nozzle of an automatic packaging machine. This suction plane may be formed at a position of the base part intersecting with the axis of symmetry.

In the present clip as above, the area where the suction plane intersects with the axis of symmetry corresponds to the suction plane to be sucked by the suction nozzle. At this area, the parts of the present clip divided along the axis of symmetry as a center have substantially the same weight. Therefore, when the sucked present clip is transferred from the embossed tape or the embossed tray to the printed wiring board or when the sucked present clip is disposed on the printed wiring board, the present clip is less likely to tilt. This can increase the positioning accuracy of the surface mount clip when the clip is surface-mounted.

The present clip may include, as the extension parts, a first extension part and a second extension part. The first extension part is in contact with a front side of a plate-like part of the conductive member, while the second extension part is in contact with a rear side of the plate-like part of the conductive member. The plate-like part of the conductive member is usually disposed substantially perpendicular to the printed wiring board. In this case, the first extension part and the second extension part can suitably have the plate-like part of the conductive member sandwiched therebetween. The first extension part and the second extension part are preferably formed disposed separately from each other when seen in a direction substantially orthogonal to the plate-like part of the conductive member (in a normal direction of the plate-like part).

The first extension part and the second extension part of the present clip are preferably formed at the positions not overlapping with each other in the direction substantially orthogonal to the plate-like part of the conductive member. In this case, as compared with the case where the extension parts are disposed at positions overlapping with each other, the work of introducing the conductive member at a position in contact with the extension parts is facilitated.

Next, some examples of an embodiment of the present disclosure are described.

[First Embodiment]

Figure 1B:
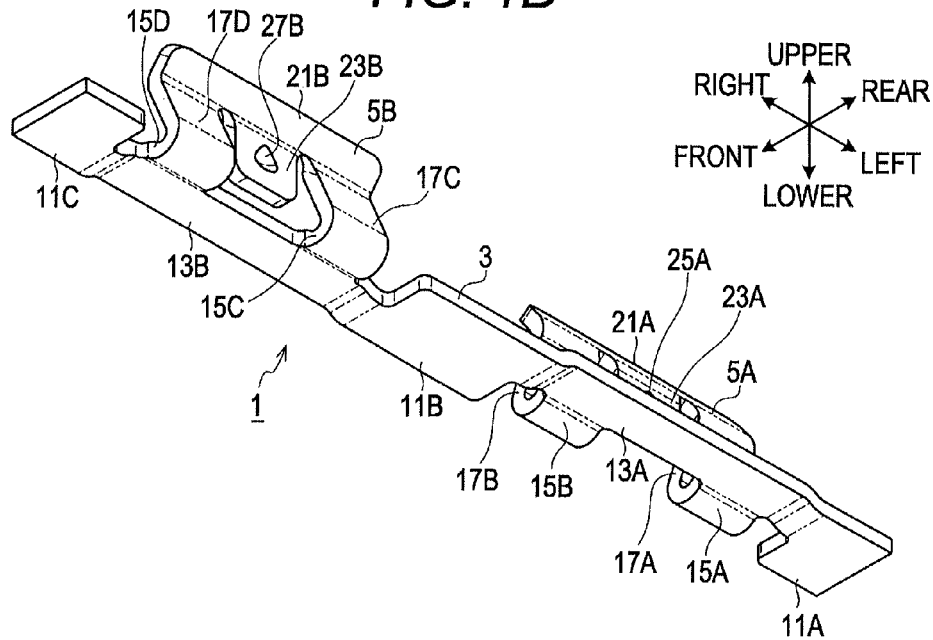
FIG. 1B is a perspective view depicting this surface mount clip from behind on the lower right.

First, a first embodiment is described. Each of FIG. 1A and FIG. 1B is a perspective view of a surface mount clip 1 according to the first embodiment of the present disclosure. FIG. 2A is a plan view of the surface mount clip 1. FIG. 2B is a front view of the surface mount clip 1. FIG. 2C is a bottom view of the surface mount clip 1. FIG. 2D is a right side view of the surface mount clip 1. Note that the rear view of the surface mount clip 1 is substantially the same as the front view. The left side view of the surface mount clip 1 is substantially the same as the right side view.

The surface mount clip 1 according to this embodiment is formed by, for example, punching and/or bending a metal thin plate. The surface mount clip 1 includes a base part 3, and extension parts 5A and 5B.

The base part 3 is solder-bonded to a printed wiring board 31. Thus, the base part 3 has a rear surface electrically connected to a conductor part of the printed wiring board 31. The base part 3 includes solder-bonding parts 11A, 11B, and 11C, and floating parts 13A and 13B.

Bottom surfaces of the solder-bonding parts 11A to 11C are bonding planes to be bonded with the printed wiring board. In the state where the solder-bonding parts 11A to 11C are solder-bonded to the printed wiring board 31, gaps are formed between the floating parts 13A and 13B and the printed wiring board 31.

The width of the floating parts 13A and 13B in the front and back direction (width of the surface mount clip 1 in a direction substantially orthogonal to the longitudinal direction) is substantially a half of the width of the solder-bonding parts 11A to 11C. The extension part 5A is formed in a range surrounded by the solder-bonding parts 11A and 11B and the floating part 13A on three sides when seen from above the surface mount clip 1 (see FIG. 2A). The extension part 5B is formed in a range surrounded by the solder-bonding parts 11B and 11C and the floating part 13B on three sides when seen from above the surface mount clip 1 (see FIG. 2A).

The extension part 5A includes root parts 15A and 15B and folded-back parts 17A and 17B. The extension part 5B includes root parts 15C and 15D and folded-back parts 17C and 17D. The root parts 15A and 15B extend from the floating part 13A. The root parts 15C and 15D extend from the floating part 13B. The root parts 15A to 15D extend in a direction approaching the printed wiring board 31 (obliquely downward) (that is, toward the rear surface of the base part 3). The folded-back parts 17A to 17D extend further from the area where the root parts 15A to 15D is the closest to the printed wiring board (the lowermost ends of the root parts 15A to 15D, i.e., the tips of the root parts 15A to 15D). The folded-back parts 17A to 17D extend in a direction apart from the printed wiring board (obliquely upward, i.e., toward the front surface of the base part 3).

Thus, the area to be the boundary between the root parts 15A to 15D and the folded-back parts 17A to 17D is the area of the extension parts 5A and 5B that is closest to the printed wiring board. More specifically, FIG. 3A and FIG. 3B depict the root part 15C and the folded-back part 17C. The area to be the boundary between the root part 15C and the folded-back part 17C and an extended surface of the lower surface of the solder-bonding part 11C (i.e., an extended surface of the bonding plane to be bonded with the printed wiring board) are close to each other to form an extremely small gap C therebetween. Although not depicted, this similarly applies to the gaps between the root parts 15A, 15B, and 15D and the folded-back parts 17A, 17B, and 17D. That is, the gap C having similar length is formed between the area to be the boundary therebetween and an extended surface of the lower surface of the solder-bonding part 11C (i.e., an extended surface of the bonding plane to be bonded with the printed wiring board).

The length of the gap C is preferably in the range of 1/1000 mm to 50/1000 mm. The length of the gap C is more desirably in the range of 1/1000 mm to 30/1000 mm. The gap C with the length in this range makes it less probable to cause the root parts 15A to 15D to abut on the printed wiring board. Therefore, the effect of wetting over, which is described later, can be maximized without affecting the bonding between the solder-bonding parts 11A to 11C and the printed wiring board.

In this embodiment, the extension parts 5A and 5B are provided with guide parts 21A and 21B, suspension parts 23A and 23B, convex parts 25A and 25B, and concave parts 27A and 27B as depicted in FIG. 1A, FIG. 1B, and FIG. 2A to FIG. 2D.

The guide part 21A is located at an upper end of the folded-back parts 17A and 17B. The guide part 21B is at an upper end of the folded-back parts 17C and 17D. The guide parts 21A and 21B are tilted from the upper end to the lower end to gradually approach the central part of the surface mount clip 1 in the front and back direction. The "front and back direction" corresponds to a direction substantially orthogonal to the longitudinal direction of the surface mount clip 1.

The suspension part 23A is suspended from the lower end of the guide part 21A at a position sandwiched between the folded-back parts 17A and 17B. The suspension part 23B is suspended from the lower end of the guide part 21B at a position sandwiched between the folded-back parts 17C and 17D. The convex part 25A is formed on the front of the suspension part 23A. The concave part 27A is formed on the back of the suspension part 23A. The convex part 25B is formed on the front of the suspension part 23B. The concave part 27B is formed on the back of the suspension part 23B.

Figure 4A:
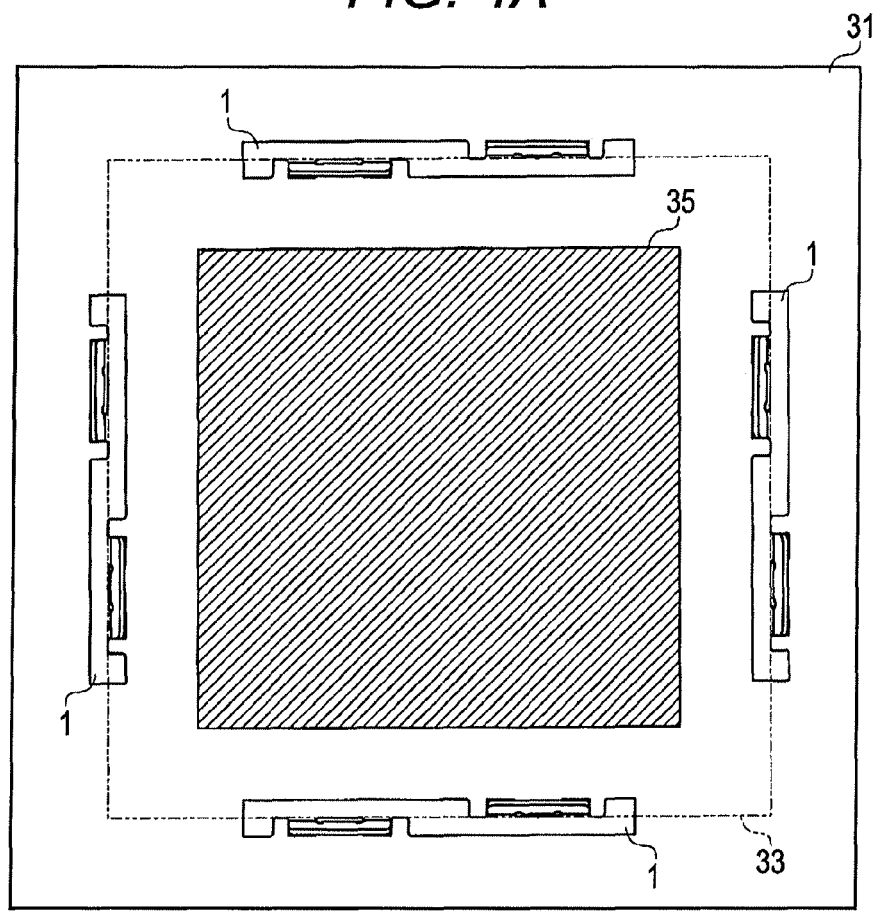
FIG. 4A is a plan view depicting the usage of the surface mount clip according to the first embodiment.
Figure 4B:
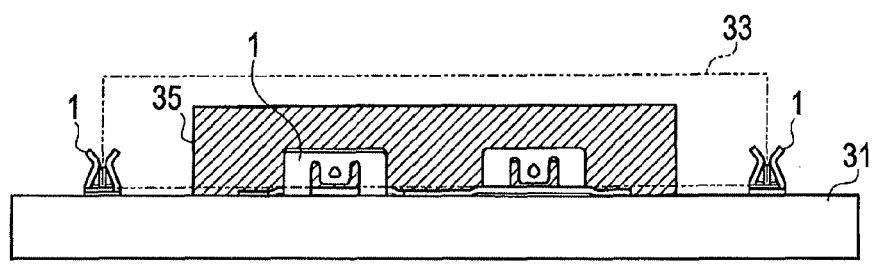
FIG. 4B is a front view thereof.
Figure 5A:
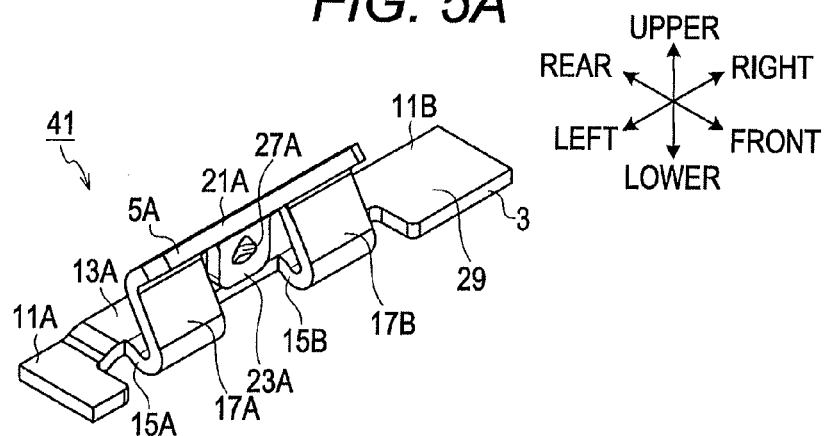
FIG. 5A is a perspective view depicting a surface mount clip according to a second embodiment from the front on the upper left.
Figure 5B:
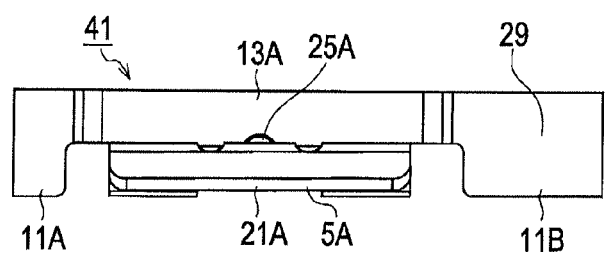
FIG. 5B is a plan view thereof.
Figure 5C:
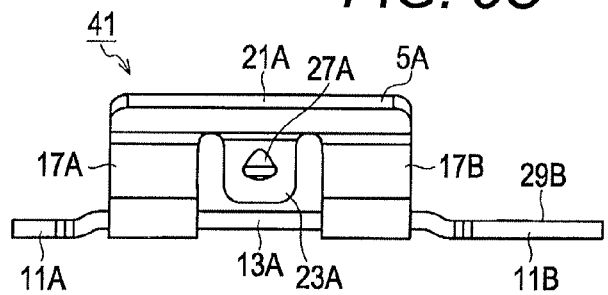
FIG. 5C is a front view thereof.
Figure 5D:
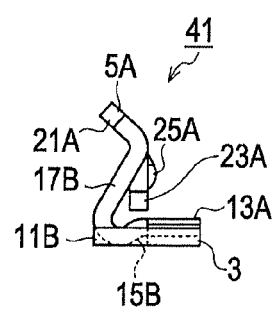
FIG. 5D is a right side view thereof.

The surface mount clip 1 having the above configuration is surface-mounted on the printed wiring board 31 for fixing a shielding case 33 to the printed wiring board 31 as depicted in, for example, FIG. 4A and FIG. 4B.

The shielding case 33 is a metal case to be attached at a position surrounding an electronic component 35. The shielding case 33 has a rectangular shape when seen from above. The shielding case 33 blocks the electromagnetic wave emitted to the outside from the electronic component 35 mounted on the printed wiring board 31. The shielding case 33 further blocks the electromagnetic wave coming from the outside toward the electronic component 35.

The surface mount clip 1 is surface-mounted on a predetermined position to be determined in accordance with the position of the electronic component 35 and the size of the shielding case 33 together with the electronic component 35. On this occasion, the surface mount clip 1 is disposed at a predetermined position on the printed wiring board 31 by an automatic packaging machine (not shown).

A suction plane 29 is formed on the solder-bonding part 11B of the surface mount clip 1. The suction plane 29 can be sucked by a suction nozzle (not shown) of the automatic packaging machine. The base part 3, and the extension parts 5A and 5B have rotational symmetry (dyad symmetry) as depicted in FIG. 2A and FIG. 2D. That is, the base part 3 and the extension parts 5A and 5B are configured to have substantially the same shape after half the rotation along an axis of symmetry, which is the axial line extending in a direction substantially orthogonal to the bonding plane (lower surface) of the solder-bonding part 11B.

Therefore, on the suction plane 29, the parts of the surface mount clip 1 divided along the axis of symmetry have the same weight. Therefore, when the surface mount clip 1 is transferred from the embossed tape (not shown) or the embossed tray (not shown) to the printed wiring board or when the surface mount clip 1 is disposed on the printed wiring board 31, the suction of the suction plane 29 with the suction nozzle of the automatic packaging machine suppresses the tilt of the surface mount clip 1. This can increase the positioning accuracy of the surface mount clip 1 when the clip is mounted on the surface of the printed wiring board 31.

After the surface mount clip 1 is mounted on the surface of the printed wiring board, the shielding case 33 is attached. For attaching the shielding case 33, the lower end of the shielding case 33 is pressed against the surface mount clip 1. That is, the lower end of the shielding case 33 is abutted on the guide parts 21A and 21B of the surface mount clip 1. Thus, the positioning of the shielding case 33 and the surface mount clip 1 can be performed.

Then, the shielding case 33 is pushed toward the printed wiring board 31. The shielding case 33 is pushed until the lower end thereof abuts on the base part 3. On this occasion, the root parts 15A to 15D and the folded-back parts 17A to 17D are elastically deformed. This elasticity (elastic force) causes the shielding case 33 to be pressed. Thus, the shielding case 33 is fixed to the printed wiring board 31. The width of the floating parts 13A and 13B is smaller than (in this embodiment, a half of) that of the solder-bonding parts 11A to 11C. Therefore, the elastic deformation of the narrow floating parts 13A and 13B can be anticipated when the shielding case 33 is pressed. In this case, the extension parts 5A and 5B are further elastically deformed with respect to these floating parts 13A and 13B as fulcrums. As a result, the shielding case 33 is fixed more firmly to the printed wiring board 31.

The surface mount clip 1 according to this embodiment includes the suspension parts 23A and 23B. Therefore, when the shielding case 33 is pushed, these suspension parts 23A and 23B are also elastically deformed. With this elasticity, the shielding case 33 is pressed. As a result, the shielding case 33 receives the pressing force from the convex parts 25A and 25B. Thus, the shielding case 33 is fixed more firmly to the printed wiring board 31.

The surface mount clip 1 is solder-bonded to the conductive pattern having a ground potential provided on the printed wiring board 31. This allows the shielding case 33 to be electrically connected to the conductive pattern having a ground potential provided on the printed wiring board 31 via the surface mount clip 1.

By the way, in a step of soldering the surface mount clip 1, a solder paste is applied on the printed wiring board 31. The surface mount clip 1 is disposed on the solder paste. The soldering is performed by heating the printed wiring board 31 and the surface mount clip 1 in a reflow furnace. On this occasion, for example, when the amount of the solder paste applied on the printed wiring board 31 is large, extra solder molten in the furnace might flow out of the interface between the solder-bonding parts 11A to 11C and the printed wiring board 31.

In this case, in the surface mount clip 1 according to this embodiment, the outflowing solder reaches the lowermost end of the extension parts 5A and 5B. The solder wets over in separation toward the root parts 15A to 15D and toward the folded-back parts 17A to 17D. Therefore, as compared with the case in which the areas corresponding to the root parts 15A to 15D do not exist, the amount of solder wetting over the folded-back parts 17A to 17D is reduced. Thus, the size of the solder fillet formed on the folded-back parts 17A to 17D by the wetting-over solder can be reduced. Accordingly, the excessive increase in rigidity of the folded-back parts 17A to 17D due to the formation of the solder fillet can be suppressed. As a result, the deterioration in spring property of the folded-back parts 17A to 17D can be suppressed.

Meanwhile, the surface mount clip according to Patent Document 1 does not have the floating parts 13A and 13B. Moreover, a flat-plate-like base part is provided at a position corresponding to the solder-bonding parts 11A to 11C of this surface mount clip. From the base part, the extension part having only the configurations corresponding to the folded-back parts 17A to 17D extends. This configuration does not have the parts corresponding to the root parts 15A to 15D. Therefore, substantially all the extra solder wets over the parts corresponding to the folded-back parts 17A to 17D. As a result, the size of the solder fillet formed in the parts corresponding to the folded-back parts 17A to 17D by the wetting-over solder is increased. Accordingly, along with the formation of the solder fillet, the rigidity of the parts corresponding to the folded-back parts 17A to 17D easily increases. As a result, the spring property of the parts corresponding to the folded-back parts 17A to 17D easily deteriorates.

Meanwhile, the surface mount clip according to Patent Document 2 has the parts corresponding to the floating parts 13A and 13B. Therefore, in this surface mount clip, a certain degree of the phenomenon that a large amount of solder wets over the parts corresponding to the folded-back parts 17A to 17D might be suppressed. However, in this surface mount clip, the extension part having the parts corresponding to the folded-back parts 17A to 17D extends from the parts corresponding to the floating parts 13A and 13B. Meanwhile, in the surface mount clip 1 according to this embodiment, the extension parts 5A and 5B including the folded-back parts 17A to 17D extend from the solder-bonding parts 11A to 11C. Therefore, the height dimension of the surface mount clip according to Patent Document 2 is larger than that of the surface mount clip 1. In the surface mount clip according to Patent Document 2, there is a possibility that extra solder cannot wet over the parts corresponding to the extension parts 5A and 5B. In this case, the extra solder might flow toward the electronic component 35.

In the surface mount clip 1 according to this embodiment, the folded-back parts 17A to 17D extend from the lower end of the root parts 15A to 15D. That is, the folded-back parts 17A to 17D extend from the position at the equivalent height to the solder-bonding parts 11A to 11C. Therefore, the height of the surface mount clip 1 can be reduced sufficiently. Moreover, in the surface mount clip 1, the extra solder also wets over the root parts 15A to 15D, unlike in the configuration in which the parts corresponding to the folded-back parts 17A to 17D extend directly from the parts corresponding to the solder-bonding parts 11A to 11C. Thus, the amount of solder wetting over the folded-back parts 17A to 17D can be reduced, and moreover the outflow of the solder toward the electronic component 35 can be suppressed.

In general, as the size of the surface mount clip is reduced, it becomes difficult to ensure the spring property of the extension parts 5A and 5B. However, the surface mount clip 1 has the root parts 15A to 15D, which extend obliquely downward from the floating parts 13A and 13B and lengthen the spring length of the extension parts 5A and 5B as a whole. As a result, the extension parts 5A and 5B are easily elastically deformed and the spring property thereof can be improved.

[Second Embodiment]

Next, a second embodiment is described. Note that a surface mount clip described in the second embodiment includes members having equivalent functions to those of the surface mount clip 1 described above. Therefore, in the second embodiment, the members having the equivalent functions to those of the first embodiment are denoted with the same reference symbols as those of the first embodiment, and the description thereof is simplified or omitted. That is, in this second embodiment, the different point from the first embodiment is mainly described.

FIG. 5A to FIG. 5D depict a surface mount clip 41 according to the second embodiment. While the surface mount clip 1 according to the first embodiment has two extension parts 5A and 5B, the surface mount clip 41 has a single extension part 5A. Due to this difference, the right-to-left-direction dimension of the surface mount clip 41 (dimension in the longitudinal direction) is shorter than that of the surface mount clip 1. Therefore, the surface mount clip 41 is smaller in size and weight than the surface mount clip 1.

More specifically, as depicted in FIG. 5A to FIG. 5D, the base part 3 of the surface mount clip 41 has a rear surface that is electrically connected to the conductor part of the printed wiring board 31. The base part 3 includes the solder-bonding parts 11A and 11B, and the floating part 13A. The extension part 5A includes the root parts 15A and 15B, and the folded-back parts 17A and 17B. The root parts 15A and 15B extend from the floating part 13A. The root parts 15A and 15B extend in a direction approaching the printed wiring board (obliquely downward, i.e., toward the rear surface of the base part 3). The folded-back parts 17A and 17B extend further from the area where the root parts 15A and 15B are the closest to the printed wiring board 31 (the lowermost ends, i.e., the tips of the root parts 15A and 15B). The folded-back parts 17A and 17B extend in a direction apart from the printed wiring board 31 (obliquely upward, i.e., toward the front surface of the base part 3). Thus, the area to be the boundary between the root parts 15A and 15B and the folded-back parts 17A and 17B is the area of the extension part 5A that is closest to the printed wiring board 31.

In the surface mount clip 41, in a manner similar to the surface mount clip 1, the molten solder in contact with the extension part 5A wets over in separation toward the root parts 15A and 15B and toward the folded-back parts 17A and 17B. This reduces the amount of solder wetting over toward the folded-back parts 17A and 17B. As a result, the size of the solder filled formed on the folded-back parts 17A and 17B side is reduced. Accordingly, the excessive increase in rigidity of the folded-back parts 17A and 17B can be suppressed. This leads to the suppression of the deterioration in spring property of the folded-back parts 17A and 17B.

Figure 6A:
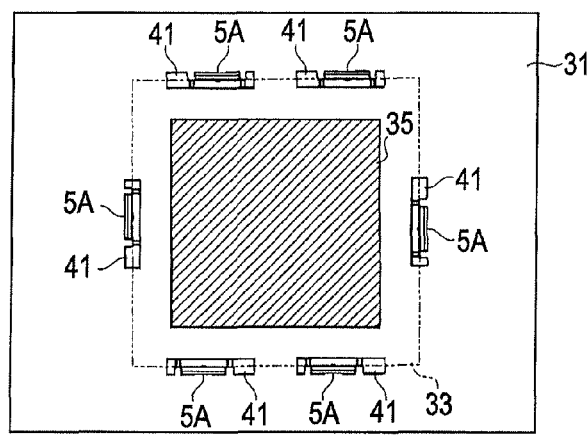
FIG. 6A to FIG. 6C depict the usage of the surface mount clip according to the second embodiment.
Figure 6B:
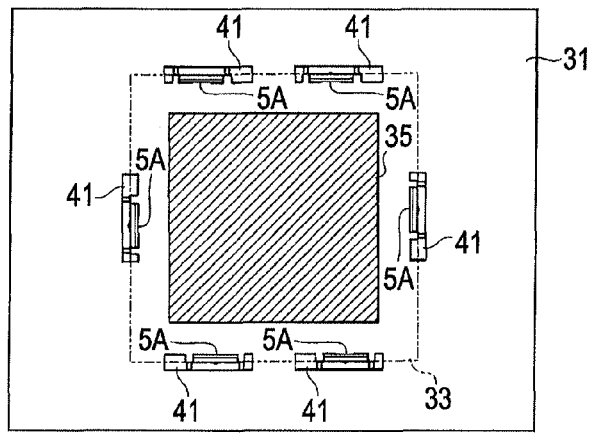
Figure 6C:
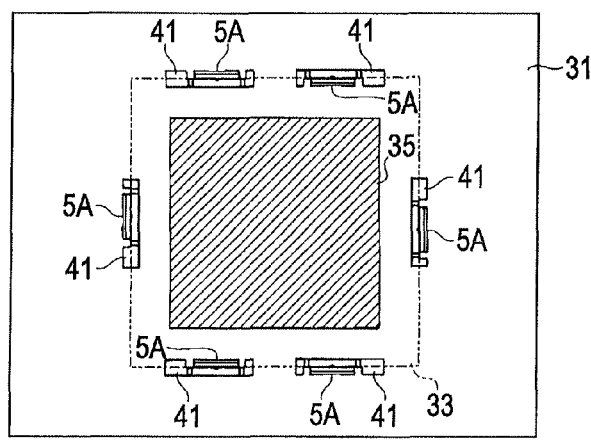

The surface mount clip 41 having the above configuration is surface-mounted on the printed wiring board 31 for fixing the shielding case 33 to the printed wiring board 31 as depicted in FIG. 6A to FIG. 6C.

The extension part 5A of the surface mount clip 41 may be disposed on the outer peripheral side of the shielding case 33, for example, as depicted in FIG. 6A. Alternatively, the extension part 5A may be disposed on the inner peripheral side of the shielding case 33 as depicted in FIG. 6B. Further alternatively, a part of the extension part 5A may be disposed on the outer peripheral side of the shielding case 33 while another part thereof may be disposed on the inner peripheral side of the shielding case 33 as depicted in FIG. 6C.

In any case, upon the attachment of the shielding case 33, the extension part 5A is elastically deformed to be in pressure contact with the shielding case 33. Accordingly, the plural surface mount clips 41 cooperate with each other to hold the shielding case 33. Note that in the surface mount clip 41, the floating part 13A is elastically deformed to be twisted like in the surface mount clip 1. This increases the pressure contact force of the extension part 5A. Furthermore, the suspension part 23A is elastically deformed. With this elasticity, the shielding case 33 is pressed.

[Another Embodiment]

Embodiments of the present disclosure have been described so far. However, the present disclosure is not limited to the above specific embodiments. The present disclosure can be alternatively implemented in various modes.

For example, the surface mount clip 1 holds the four sides (four positions) of the shielding case 33 in the example depicted in FIG. 4A. However, the surface mount clip 1 can alternatively hold the two positions (for example, two sides) of the shielding case 33 to fix the shielding case 33 to the printed wiring board 31. Thus, whether the shielding case 33 is held at the four positions or not depends on a user. When a larger shielding case is held, the shielding case may be held at five or more positions.

The surface mount clip 1 according to the first embodiment has the two extension parts 5A and 5B. Therefore, in this configuration, it is difficult for one surface mount clip 1 to hold the shielding case. However, the surface mount clip 1 may have three or more parts corresponding to the extension part 5A and/or the extension part 5B. In this case, the one surface mount clip 1 alone can hold the shielding case.

Moreover, it is difficult for one surface mount clip 1 or 41 having two or less extension parts to hold the shielding case 33 as mentioned above. However, by using one surface mount clip 1 or 41 in combination with another holding structure or another surface mount clip, the shielding case 33 can be held. Therefore, the shielding case 33 can be held without the use of the plural surface mount clips 1 or 41.

Figure 7A:
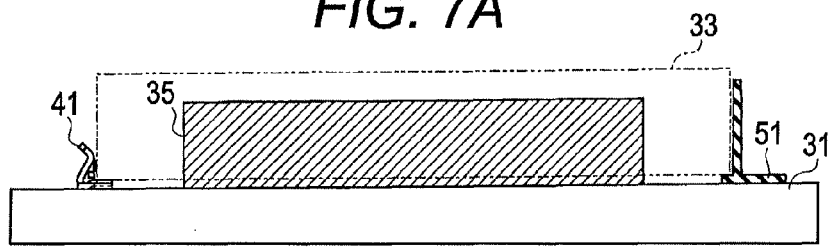
FIG. 7A to FIG. 7D depict the usage of the surface mount clip according to the second embodiment.

For example, a wall member (another member) 51 may be provided on the printed wiring board 31 as depicted in FIG. 7A. This wall member 51 has a wall plane substantially vertical to the surface of the printed wiring board 31. In the case of using this wall member 51, the outer surface of the shielding case 33 is pressed against this wall member 51. Further, another outer surface of the shielding case 33 facing the outer surface is brought into pressure contact with the surface mount clip 41. The use of this wall member 51 allows the surface mount clip 41 and the wall member 51 to cooperate with each other to hold the shielding case 33.

In the case of using this wall member 51, the number of surface mount clips 41 for holding the shielding case 33 can be different depending on the position of the wall member 51 on the printed wiring board 31. In view of this, the plural wall members 51 may be provided for the printed wiring board 31. In this case, one surface mount clip 41 is enough as long as the action of the shielding case 33 is sufficiently restricted by the wall member 51. This point similarly applies to the surface mount clip 1.

Figure 7B:
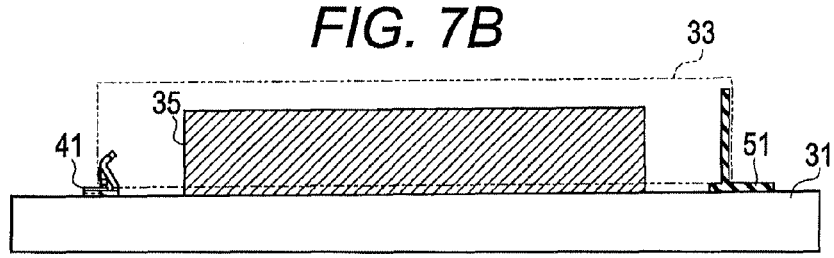

In FIG. 7A, the surface mount clip 41 is in contact with the outer peripheral side of the shielding case 33. Besides this, as depicted in FIG. 7B, the surface mount clip 41 may be in contact with the inner peripheral side of the shielding case 33. Even in this case, the surface mount clip 41 can cooperate with the wall member 51 to hold the shielding case 33.

Figure 7C:
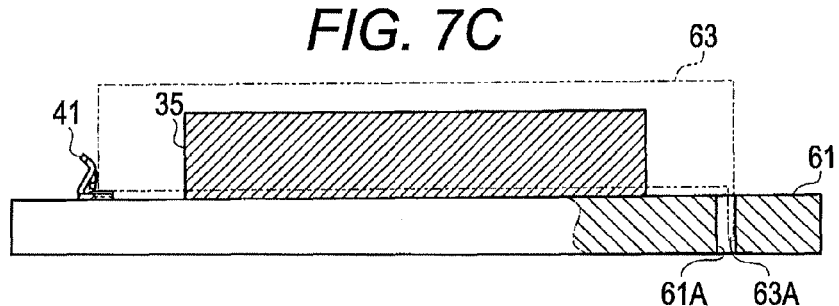

Moreover, the member for allowing one surface mount clip 1 or 41 to hold the shielding case is not limited to the wall member 51. For example, as depicted in FIG. 7C, a printed wiring board 61 may have a penetration hole 61A (or a concave part which does not penetrate). In this case, a projecting part 63A provided in a projecting manner for a shielding case 63 is inserted into the penetration hole 61A. This penetration hole 61A can also restrict the action of the shielding case 63. In this case, the surface mount clip 41 is brought into pressure contact with the external surface of the shielding case 63 which faces the external surface having the projecting part 63A. This allows the surface mount clip 41 and the penetration hole 61A to cooperate with each other to hold the shielding case 63.

Figure 7D:
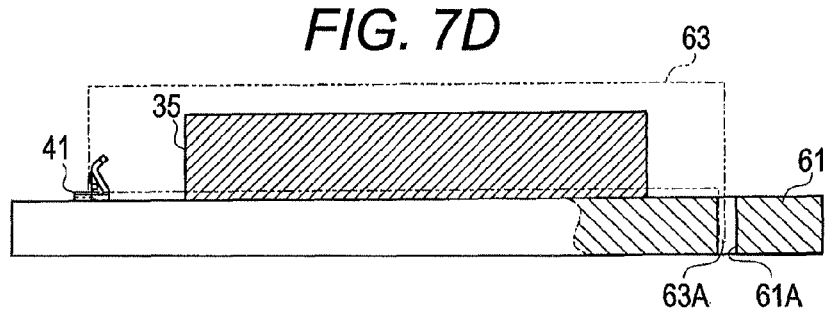

Note that in FIG. 7C, the surface mount clip 41 is in contact with the outer peripheral side of the shielding case 63. However, the surface mount clip 41 may alternatively be in contact with the inner peripheral side of the shielding case 63 as depicted in FIG. 7D.

The surface mount clip according to the present disclosure may be any of the following first to seventh surface mount clips. Specifically, a first surface mount clip includes: a base part electrically connected to a conductor part of a printed wiring board by being solder-bonded to a printed wiring board; and an extension part extending from the base part, the extension part being configured to be brought into contact with a conductive member attached to the printed wiring board in connection with elastic deformation of the extension part to hold the conductive member and make electrical connection to the conductive member, wherein the base part includes a solder-bonding part having a bonding plane to be bonded with the printed wiring board and a floating part forming a gap from the printed wiring board in a state that the solder-bonding part is solder-bonded to the printed wiring board and wherein the extension part includes a root part extending from the floating part in a direction approaching the printed wiring board, and a folded-back part further extending from an area of the root part that is closest to the printed wiring board in a direction apart from the printed wiring board. When the molten solder flows into the gap between the extension part and the printed wiring board, the root part makes the solder wet over toward the root part to reduce the amount of solder wetting over toward the folded-back part.

A second surface mount clip is the first surface mount clip wherein one surface mount clip has a single extension part and the extension parts included in the plural surface mount clips cooperate with each other or the extension part included in the surface mount clip cooperate with another component to hold the conductive member.

A third surface mount clip is the second surface mount clip wherein the base part has a suction plane that can be sucked by a suction nozzle of an automatic packaging machine.

A fourth surface mount clip is the first surface mount clip wherein one surface mount clip has a plurality of extension parts and the extension parts of the surface mount clips cooperate with each other, the extension part of the surface mount clip cooperates with another member, or the extension parts of one surface mount clip cooperate with each other to hold the conductive member.

A fifth surface mount clip is the fourth surface mount clip wherein the clip has a shape with rotational symmetry, the shape remaining the same after a half turn along an axial line extending in a direction substantially orthogonal to the bonding plane of the solder-bonding part as an axis of symmetry.

A sixth surface mount clip is the fifth surface mount clip wherein the base part has a suction plane that can be sucked with a suction nozzle of an automatic packaging machine, at a position on the base part intersecting with the axis of symmetry.

A seventh surface mount clip is any of the fourth to sixth surface mount clips wherein the extension part includes, when a plate-like part of the conductive member is disposed vertical to the printed wiring board, a first extension part in contact with a front side of a plate-like part and a second extension part in contact with a rear side of the plate-like part, and the first extension part and the second extension part are disposed at position not overlapping with each other in a direction substantially orthogonal to the plate-like part.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A surface mount clip comprising:
    a base part having a rear surface electrically connected to a conductor part of a printed wiring board; and
    an extension part extending from the base part, the extension part being configured to be brought into contact with a conductive member attached to the printed wiring board with elastic deformation of the extension part to hold the conductive member and make an electrical connection to the conductive member, wherein:
    the base part includes a solder-bonding part having a bonding plane to be bonded with the printed wiring board and a floating part spaced from the bonding plane so as to form a floating part gap between the floating part and the printed wiring board, once the surface mount clip is solder-bonded to the printed wiring board;
    the extension part includes a root part extending from the floating part toward the rear surface of the base part and a folded-back part extending from an end of the root part toward a front surface of the base part; and
    a lowermost portion of the extension part being spaced from the printed wiring board by an extension part gap, and the extension part gap being smaller than the floating part gap.

2. The surface mount clip according to claim 1, wherein the extension part is provided singly.

3. The surface mount clip according to claim 1, wherein the base part has a suction plane that can be sucked by a suction nozzle.

4. The surface mount clip according to claim 1, wherein the extension part is provided in plurality.

5. The surface mount clip according to claim 4, wherein the clip has a shape rotationally symmetric with respect to an axial line extending in a direction substantially orthogonal to the bonding plane of the solder-bonding part, the axial line being provided as an axis of symmetry, and the shape remains the same after half the rotation along the axial line.

6. The surface mount clip according to claim 5, wherein the base part has a suction plane that can be sucked with a suction nozzle, at a position on the base part intersecting with the axis of symmetry.

7. The surface mount clip according to claim 1, wherein the extension part includes a first extension part in contact with a front side of a plate-like part of the conductive member and a second extension part in contact with a rear side of the plate-like part of the conductive member.

8. The surface mount clip according to claim 7, wherein the first extension part and the second extension part are disposed separately from each other in a direction substantially orthogonal to the plate-like part.

9. The surface mount clip according to claim 1, wherein the extension part gap is between 1/1000 mm and 50/1000 mm.

10. The surface mount clip according to claim 1, wherein the extension part gap is between 1/1000 mm and 30/1000 mm.

11. The surface mount clip according to claim 1, wherein the lowermost portion of the extension part is configured to maximize an effect of wetting over without affecting a bonding between the solder-bonding part and the printed wiring board.

* * * * *